(12) United States Patent
Shiraishi et al.

(10) Patent No.: US 11,987,138 B2
(45) Date of Patent: May 21, 2024

(54) MANAGEMENT APPARATUS, MANAGEMENT METHOD

(71) Applicant: GS Yuasa International Ltd., Kyoto (JP)

(72) Inventors: Takeyuki Shiraishi, Kyoto (JP); Satoru Narimoto, Kyoto (JP)

(73) Assignee: GS YUASA INTERNATIONAL LTD., Kyoto (JP)

(*) Notice: Subject to any disclaimer, the term of this patent is extended or adjusted under 35 U.S.C. 154(b) by 470 days.

(21) Appl. No.: 17/291,915

(22) PCT Filed: Nov. 12, 2019

(86) PCT No.: PCT/JP2019/044340
§ 371 (c)(1),
(2) Date: May 6, 2021

(87) PCT Pub. No.: WO2020/100896
PCT Pub. Date: May 22, 2020

(65) Prior Publication Data
US 2022/0009352 A1    Jan. 13, 2022

(30) Foreign Application Priority Data
Nov. 12, 2018    (JP) ................... 2018-212036

(51) Int. Cl.
*B60L 3/00* (2019.01)
*B60L 58/12* (2019.01)
(Continued)

(52) U.S. Cl.
CPC ............. *B60L 3/0046* (2013.01); *B60L 58/12* (2019.02); *G01R 31/3835* (2019.01);
(Continued)

(58) Field of Classification Search
CPC .. B60L 3/0046; B60L 58/12; B60L 2240/545; B60L 2240/547;
(Continued)

(56) References Cited

U.S. PATENT DOCUMENTS

| | | | |
|---|---|---|---|
| 10,393,814 B2 | 8/2019 | Takashima et al. | |
| 2016/0190843 A1* | 6/2016 | Yang | G01R 31/36 320/152 |

(Continued)

FOREIGN PATENT DOCUMENTS

| | | |
|---|---|---|
| JP | H06-331714 A | 12/1994 |
| JP | 2001-272444 A | 10/2001 |

(Continued)

OTHER PUBLICATIONS

International Search Report (ISR) (PCT Form PCT/ISA/210), in PCT/JP2019/044340, dated Dec. 17, 2019.

*Primary Examiner* — Paul Dinh
(74) *Attorney, Agent, or Firm* — MCGINN I.P. LAW GROUP, PLLC

(57) ABSTRACT

A management apparatus for an energy storage device, wherein after the start of counting an elapsed time since a current of the energy storage device became equal to or smaller than a first threshold, when a predetermined condition in which the voltage of the energy storage device is possibly not stable is satisfied at a time point where the count reaches a stabilization time (predetermined value), the count of the elapsed time is changed.

20 Claims, 15 Drawing Sheets

(51) Int. Cl.
*G01R 31/3835* (2019.01)
*G01R 31/389* (2019.01)
*H01M 10/44* (2006.01)
*H01M 10/48* (2006.01)
*H02J 7/00* (2006.01)

(52) U.S. Cl.
CPC ........ *G01R 31/389* (2019.01); *H01M 10/443* (2013.01); *H01M 10/48* (2013.01); *H01M 10/486* (2013.01); *H02J 7/0048* (2020.01); *H02J 7/007182* (2020.01); *B60L 2240/545* (2013.01); *B60L 2240/547* (2013.01); *B60L 2240/549* (2013.01); *B60L 2240/80* (2013.01); *H01M 2220/20* (2013.01)

(58) Field of Classification Search
CPC ........... B60L 2240/549; B60L 2240/80; G01R 31/3835; G01R 31/389; G01R 31/382; H01M 10/443; H01M 10/48; H01M 10/486; H01M 2220/20; H02J 7/0048; H02J 7/007182; H02J 7/0071; H02J 7/00712; H02J 7/00716; H02J 7/007194; Y02E 60/10; Y02T 10/70

USPC ........................................................ 320/152
See application file for complete search history.

(56) References Cited

U.S. PATENT DOCUMENTS

| | | |
|---|---|---|
| 2016/0259010 A1 | 9/2016 | Syouda |
| 2018/0074129 A1* | 3/2018 | Nakao .................... B60L 50/60 |
| 2018/0306866 A1 | 10/2018 | Tamegai et al. |
| 2018/0313906 A1* | 11/2018 | Takahashi ............ G01R 31/382 |

FOREIGN PATENT DOCUMENTS

| | | |
|---|---|---|
| JP | 2002-365347 A | 12/2002 |
| JP | 2007-292648 A | 11/2007 |
| JP | 2010-086764 A | 4/2010 |
| JP | 2015-117951 A | 6/2015 |
| WO | WO 2015/008620 A1 | 1/2015 |
| WO | WO 2017/110578 A1 | 6/2017 |

* cited by examiner

MANAGEMENT APPARATUS, MANAGEMENT METHOD

TECHNICAL FIELD

The present invention relates to a management apparatus for an energy storage device.

BACKGROUND ART

Even when the energy storage device comes into substantially a no-current state where the current is equal to or smaller than a threshold due to charge-discharge stop, the voltage of the energy storage device fluctuates because a chemical reaction continues inside the energy storage device immediately after the current becomes equal to or smaller than the threshold. The chemical reaction decreases with the lapse of time, and when the elapsed time after the current becomes equal to or smaller than the threshold reaches a stabilization time, the voltage of the energy storage device becomes substantially stable. Generally, the voltage at the time when the current is equal to or smaller than the threshold and stable is determined to be open circuit voltage (OCV). In Patent Document 1 below, the state of charge (SOC) of an energy storage device is estimated using OCV.

PRIOR ART DOCUMENT

Patent Document

Patent Document 1: JP-A-2002-365347

SUMMARY OF THE INVENTION

Problems to be Solved by the Invention

When a current equal to or larger than the threshold flows after the start of counting the elapsed time since the current of the energy storage device became equal to or smaller than the threshold, for example, it is conceivable that the elapsed time is restored by temporarily resetting a counter for the elapsed time. However, when the number of times the current exceeds the threshold is large, there is a concern that the frequency of restoring the elapsed time increases.

An object of the present invention is to reduce the frequency of resetting the elapsed time.

Means for Solving the Problems

In a management apparatus for an energy storage device, after the start of counting the elapsed time since the current of the energy storage device became equal to or smaller than a first threshold, when a predetermined condition in which the voltage of the energy storage device is possibly not stable is satisfied at a time point where the count of the elapsed time reaches a predetermined value, the count of the elapsed time is changed.

The present technique can be applied to a management method for an energy storage device, a management program, and a recording medium in which the management program is recorded.

Advantages of the Invention

The frequency of resetting the count of the elapsed time can be reduced.

Figure 1:
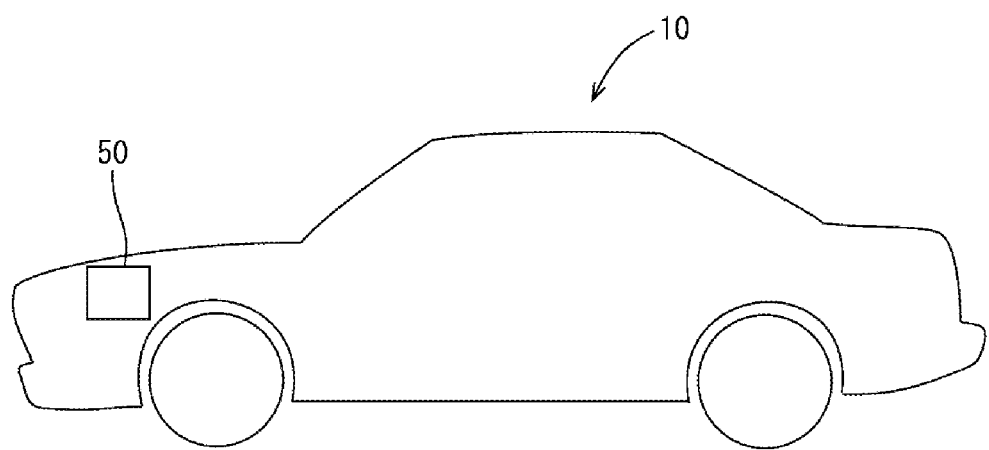
FIG. 1 is a side view of a vehicle in an embodiment.

MODE FOR CARRYING OUT THE INVENTION (1) Even when the energy storage device comes into a state where the current is equal to or smaller than a threshold and there can be considered to be no current due to charge-discharge stop, immediately thereafter, a chemical reaction continues inside the energy storage device. By counting the elapsed time since the state became the state where there can be considered to be no current, the time when the chemical reaction converges and the voltage becomes stable can be predicted. Generally, the voltage is determined to be stable when the elapsed time since the state became the state where there can be considered to be no current reaches a predetermined stabilization time. In recent years, due to an increase in the number of electric apparatuses mounted on a vehicle, such as a security apparatus and a global positioning system (GPS) apparatus, a current equal to or larger than a first threshold may flow irregularly regardless of the state of the vehicle depending on the operation of the electric apparatuses.

In a case where a current of a certain magnitude temporarily flows after the start of counting the elapsed time, even when the elapsed time reaches the stabilization time, the voltage may not become stable due to a chemical reaction caused by the current having flowed temporarily. In such a case, for example, it is conceivable to temporarily reset the counter of the elapsed time to restore the elapsed time. When the count of the elapsed time is restored and another count is made, the time when the stabilization time is reached is delayed by the amount of time restored, so that it is possible to create a time until the chemical reaction due to the current having temporarily flowed converges and the voltage becomes stable. However, when the count of the elapsed time is restored each time a current of a certain magnitude flows, the frequency of reaching the stabilization time decreases, and the frequency of obtaining the OCV decreases.

For the reasons described above, reducing the frequency of resetting the elapsed time has become one of important themes. Also, in energy storage devices other than those for vehicles, a current of a certain magnitude may flow irregularly to the energy storage device due to the operation of an apparatus or a system, and hence there is a similar problem.

The inventors have found that even when a current of a certain magnitude temporarily flows in the energy storage device after the current becomes equal to or smaller than a first threshold, the voltage of the energy storage device may be stable at a time point where the count reaches a predetermined value.

In a management apparatus for an energy storage device, after the start of counting the elapsed time since the current of the energy storage device became equal to or smaller than a first threshold, when a predetermined condition in which the voltage of the energy storage device is possibly not stable is satisfied at a time point where the count of the elapsed time reaches a predetermined value, the count of the elapsed time is changed. That the voltage is not stable means that, for example, that the amount of change in voltage per unit time is larger than a reference value. This reference value can be determined as appropriate.

After the start of the count, when a predetermined condition in which the voltage of the energy storage device is possibly not stable is satisfied at a time point where the count reaches a predetermined value, the count of the elapsed time is changed, whereby the frequency of resetting the count of the elapsed time can be reduced as compared to a case where the count of the elapsed time is always reset when a current of a certain magnitude flows temporarily.

In the case of changing the count of the elapsed time, the value of the present count may be decreased or increased. For example, in the case of an up counter in which the initial value of the count is set to 0, and the count is added as time passes, the present value is reduced. Thus, the count of the elapsed time is restored. In the case of a down-counter in which the initial value of the count is set to a value corresponding to a stabilization time, and the count is subtracted as time passes, the present value is increased. Thus, the count of the elapsed time is restored.

In the case of changing the count, the count may be restored to the initial value or changed to a value between the present value and the initial value. In the following description, restoring the count to the initial value is referred to as resetting.

(2) The predetermined condition may be that a current integration amount obtained by integrating a current equal to or larger than a second threshold is larger than an allowable value.

The inventors have found that when the current equal to or larger than the second threshold temporarily flows in the energy storage device after the current becomes equal to or smaller than the first threshold, whether or not there is a change in the time from the start of counting the elapsed time until the voltage becomes stable correlates with the current integration amount of the current having temporarily flowed after the start of the count.

By setting the predetermined condition to that the current integration amount obtained by integrating the current equal to or larger than the second threshold is larger than the allowable value, the frequency of resetting the count of the elapsed time can be reduced as compared to a case where the count of the elapsed time is always reset when the current equal to or larger than the second threshold flows temporarily.

(3) The predetermined condition may be that the time during which the current equal to or larger than the second threshold flowed is larger than an allowable value.

The inventors have found that when the current equal to or larger than the second threshold temporarily flows in the energy storage device after the current becomes equal to or smaller than the first threshold, whether or not there is a change in the time from the start of counting the elapsed time until the voltage becomes stable correlates with the time during which the current equal to or larger than the second threshold flowed.

By setting the predetermined condition to that the time during which the current equal to or larger than the second threshold flowed is larger than the allowable value, the frequency of resetting the count of the elapsed time can be reduced as compared to a case where the count of the elapsed time is always reset when the current equal to or larger than the second threshold flows temporarily.

(4) The second threshold may be smaller as the elapsed time from the start of the count is longer.

When the remaining time until the stabilization time is reached is long, the voltage may become stable by the stabilization time even when the current flows. In contrast, when the remaining time until the stabilization time is reached is short, the voltage may not become stable by the stabilization time even when a current of the same magnitude flows. When the remaining time until the stabilization time is reached is short, the time until the voltage becomes table can be ensured by reducing the second threshold.

(5) The first threshold and the second threshold may be the same values.

In order to appropriately determine whether or not to change the count of elapsed time, it is not desirable for the first threshold and the second threshold to be significantly different from each other. According to the management apparatus described above, since the first threshold and the second threshold are the same values, it can be appropriately determined whether or not to change the count of the elapsed time.

(6) The amount by which the count of the elapsed time is to be changed may be determined based on the time during which the current equal to or larger than the second threshold flowed.

Since the time until the voltage becomes stable is correlated with the time during which the current equal to or larger than the second threshold flowed, the count can be appropriately changed by determining the amount by which the count of the elapsed time is to be changed based on the time during which the current equal to or larger than the second threshold flowed.

The amount by which the count of elapsed time is to be changed may be determined based on the time itself during which the current equal to or larger than the second threshold flowed. The current integration amount is a value obtained by integrating a product of a periodically measured current value and a cycle, the current integration amount is also a value based on the time during which the current equal to or larger than the second threshold flowed. For this reason, the amount by which the count of the elapsed time is to be changed may be determined based on the current integration amount.

(7) The amount by which the count of the elapsed time is to be changed may be determined based on the time during which the current equal to or larger than the second threshold flowed and a value correlated with an internal resistance value of the energy storage device.

The time from when the state becomes the state where there can be considered to be no current to when the voltage becomes stable is influenced by the internal resistance value of the energy storage device in addition to the time during which the current equal to or larger than the second threshold flowed. For example, in a case where the internal resistance value is large, the time required for the voltage to become stable is longer than when the internal resistance value is small, even when the time during which the current equal to or larger than the second threshold flowed is the same.

According to the management apparatus described above, the amount by which the count of the elapsed time is to be changed is determined based not only on the time during which the current equal to or larger than the second threshold flowed but also on a value correlated with the internal resistance value of the energy storage device, the amount by which the count of the elapsed time is to be changed can be appropriately determined as compared to a case where the determination is made based only on the time during which the current equal to or larger than the second threshold flowed.

The internal resistance value correlates with the temperature and the degree of deterioration of the energy storage device. The value correlated with the internal resistance value may be the internal resistance value itself, the temperature, or the degree of deterioration.

(8) The value that correlates with the internal resistance value of the energy storage device may be the temperature of the energy storage device.

As described above, the internal resistance value correlates with the temperature and the degree of deterioration in the energy storage device. Since the temperature is easier to measure than the internal resistance value, it is easier to obtain the value correlated with the internal resistance value than a case where the internal resistance value is used. Since the temperature has a large influence on the internal resistance value as compared to the degree of deterioration, the amount by which the count of the elapsed time is to be changed can be appropriately determined as compared to a case where the degree of deterioration is used.

(9) The estimation processing for estimating the SOC of the energy storage device may be performed based on the OCV.

Since the frequency of resetting the count of the elapsed time is small, the frequency of obtaining the OCV increases, and the failure of obtaining the OCV over a long period of time can be prevented.

(10) The estimation processing for estimating the SOC of the energy storage device may be performed based on the OCV.

An increase in the frequency of obtaining the OCV leads to an increase in the frequency of estimating the SOC. It is possible to prevent a state where the SOC cannot be estimated over a long period of time and to improve the SOC estimation accuracy.

(11) The allowable value may be smaller as the elapsed time from the start of the count is longer.

As the elapsed time after the start of the count becomes longer, the chemical reaction of the energy storage device converges, and the voltage comes close to becoming stable. When the chemical reaction converges, and the voltage comes close to becoming stable, if the current equal to or larger than the threshold flows, the influence of the change in voltage due to the current having temporarily flowed does not subside even when the stabilization time is reached. The allowable value is made smaller as the elapsed time after the start of the count is longer, so that the elapsed time can be prevented from reaching the stabilization time while the voltage remains unstable. Since the non-stable voltage can be prevented from being determined as the OCV, the SOC estimation accuracy is improved.

First Embodiment

1. Description of Battery

Figure 2:
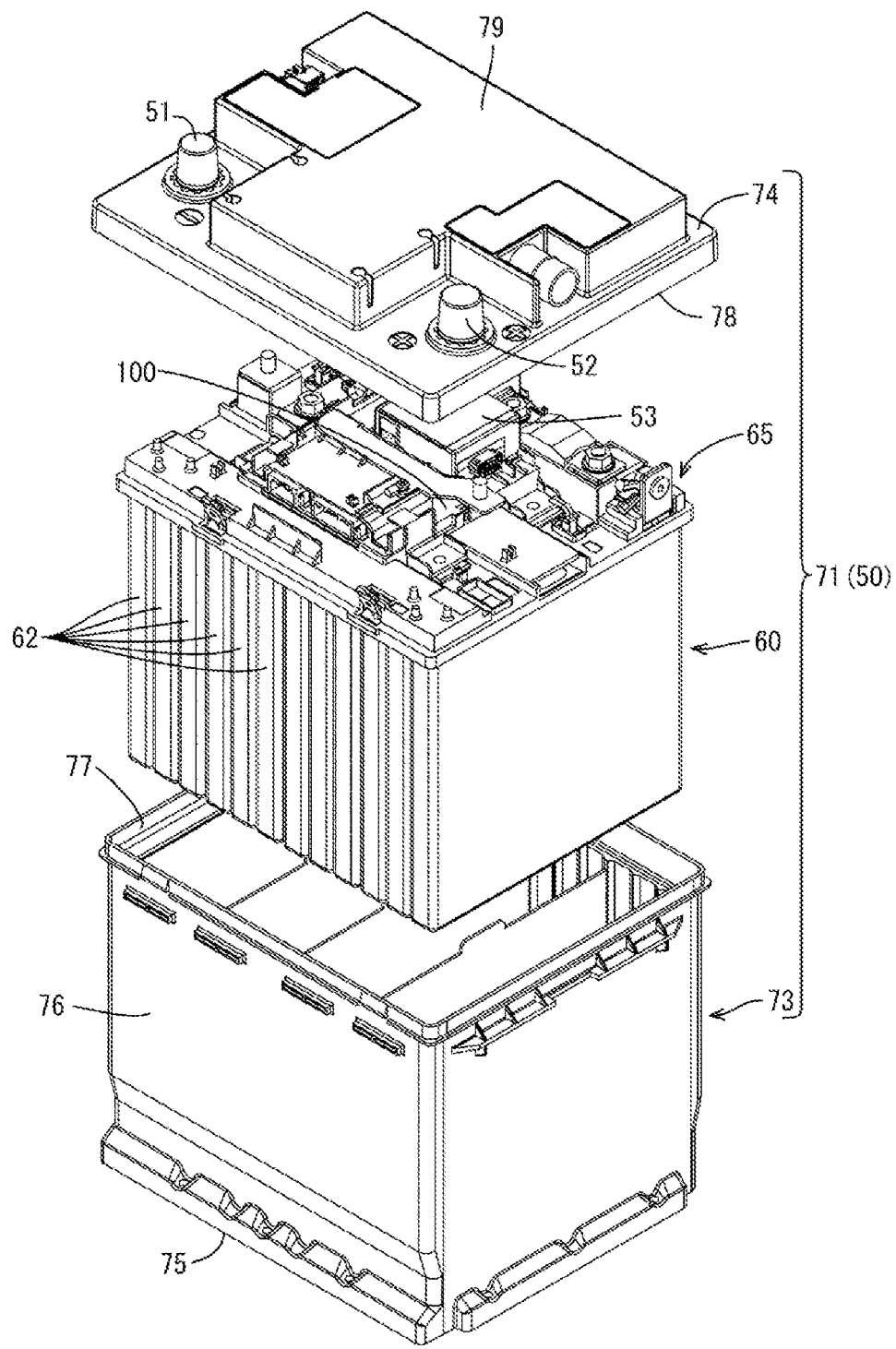
FIG. 2 is an exploded perspective view of a battery.

FIG. 1 is a side view of a vehicle, and FIG. 2 is an exploded perspective view of a battery. A vehicle 10 is an engine-driven vehicle and includes a battery 50. In FIG. 1, only the vehicle 10 and the battery 50 are shown, and other parts constituting the vehicle 10 are omitted.

The battery 50 includes an assembled battery 60, a circuit board unit 65, and a housing 71. The battery is an example of the "energy storage apparatus".

As shown in FIG. 2, the housing 71 includes a body 73 made of a synthetic resin material and a lid body 74. The body 73 has a bottomed cylindrical shape. The body 73 includes a bottom surface portion 75 and four side surface portions 76. An upper opening 77 is formed in an upper-end portion by the four side surface portions 76.

The housing 71 houses the assembled battery 60 and a circuit board unit 65. The assembled battery 60 has twelve secondary batteries 62. The twelve secondary batteries 62 are connected with three in parallel and four in series. The circuit board unit 65 is disposed in the upper portion of the assembled battery 60. In the block diagram of FIG. 6, three secondary batteries 62 connected in parallel are represented by one battery symbol. The secondary battery 62 is an example of the "energy storage device".

The lid body 74 closes the upper opening 77 of the body 73. An outer peripheral wall 78 is provided around the lid body 74. The lid body 74 has a protrusion 79 in a substantially T-shape in plan view. The external terminal 51 of the positive electrode is fixed to one corner of the front portion of the lid body 74, and the external terminal 52 of the negative electrode is fixed to the other corner portion.

Figure 3:
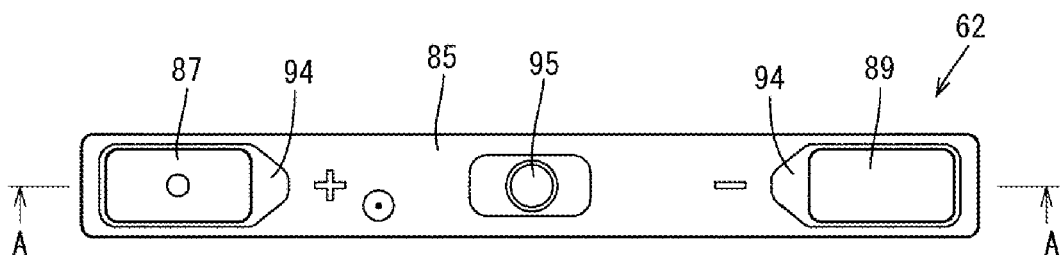
FIG. 3 is a plan view of a secondary battery.
Figure 4:
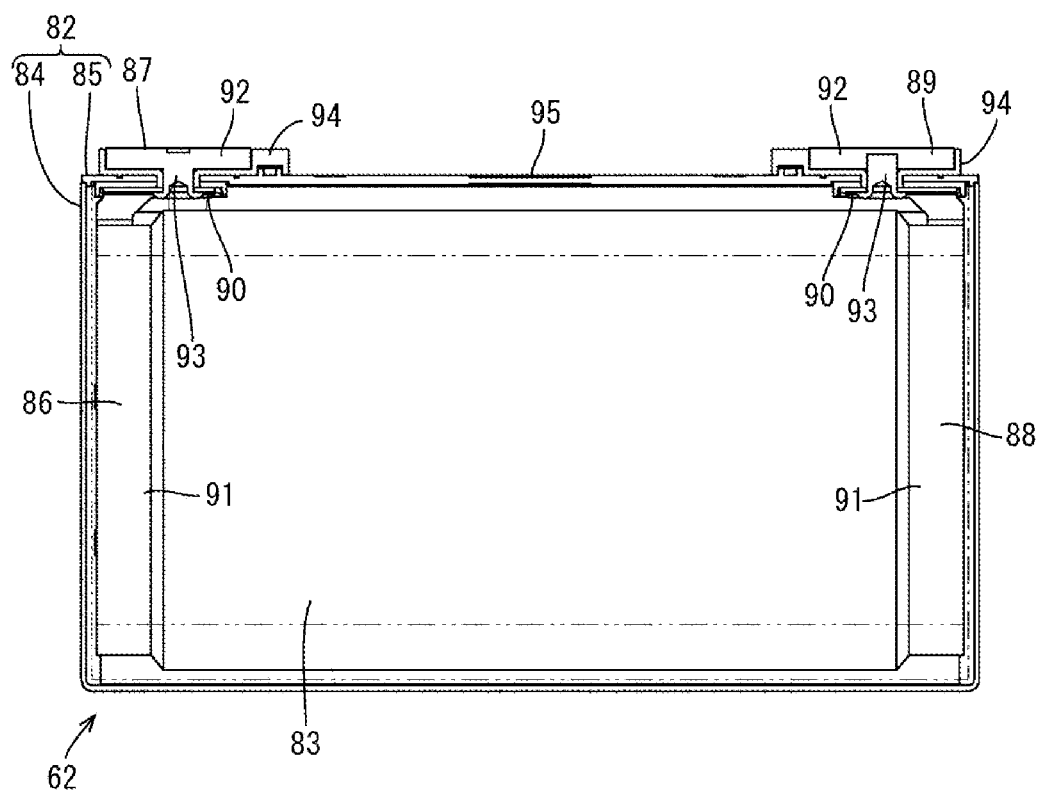
FIG. 4 is a cross-sectional view taken along line A-A in FIG. 3.

As shown in FIGS. 3 and 4, the secondary battery 62 houses an electrode assembly 83 together with a nonaqueous electrolyte in a case 82 having a rectangular parallelepiped shape. The secondary battery 62 is, for example, a lithium ion secondary battery. The case 82 has a case body 84 and a lid 85 for closing an opening at the top of the case body 84.

Although not shown in detail, the electrode assembly 83 has a separator, made of a porous resin film, disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 84 in a state where the negative electrode element and the positive electrode element are displaced from each other on the opposite sides in the width direction with respect to the separator.

The positive electrode element is connected to a positive electrode terminal 87 via a positive electrode current collector 86, and the negative electrode element is connected to a negative electrode terminal 89 via a negative electrode current collector 88. Each of the positive electrode current collector 86 and the negative electrode current collector 88 is made up of a plate-shaped base 90 and legs 91 extending from the base 90. A through hole is formed in the base 90.

The leg 91 is connected to the positive electrode element or the negative electrode element. Each of the positive electrode terminal 87 and the negative electrode terminal 89 is made up of a terminal body portion 92 and a shaft 93 protruding downward from the center portion of the lower surface of the terminal body portion 92. The terminal body portion 92 and the shaft 93 of the positive electrode terminal 87 are integrally formed of aluminum (single material). In the negative electrode terminal 89, the terminal body portion 92 is made of aluminum, the shaft 93 is made of copper, and these are assembled. The terminal body portions 92 of the positive electrode terminal 87 and the negative electrode terminal 89 are arranged at both ends of the lid 85 via gaskets 94 made of an insulating material and are exposed to the outside from the gaskets 94.

The lid 85 has a pressure release valve 95. As shown in FIG. 3, the pressure release valve 95 is located between the positive electrode terminal 87 and the negative electrode terminal 89. The pressure release valve 95 is opened when the internal pressure of the case 82 exceeds a limit value to lower the internal pressure of the case 82.

Figure 5:
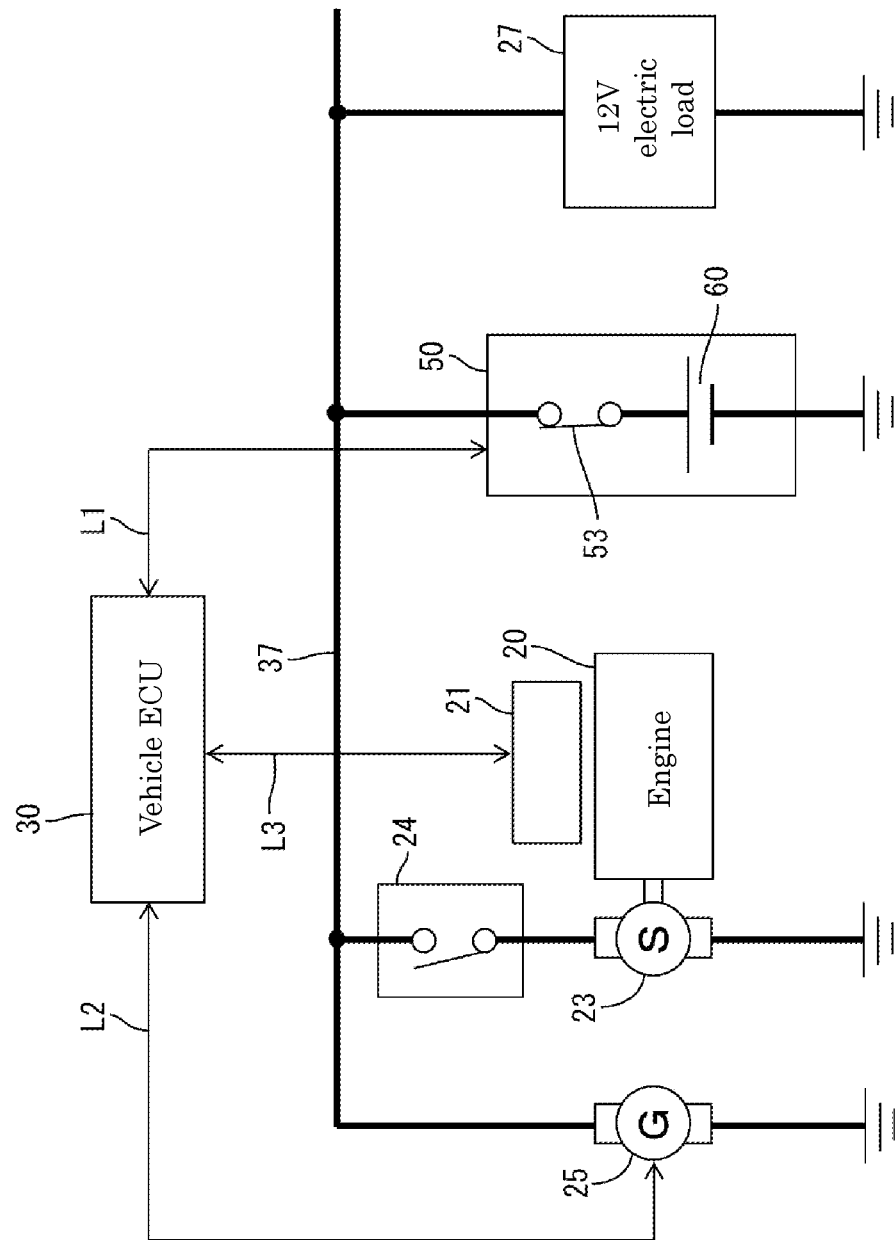
FIG. 5 is a block diagram showing an electrical configuration of the vehicle.
Figure 6:
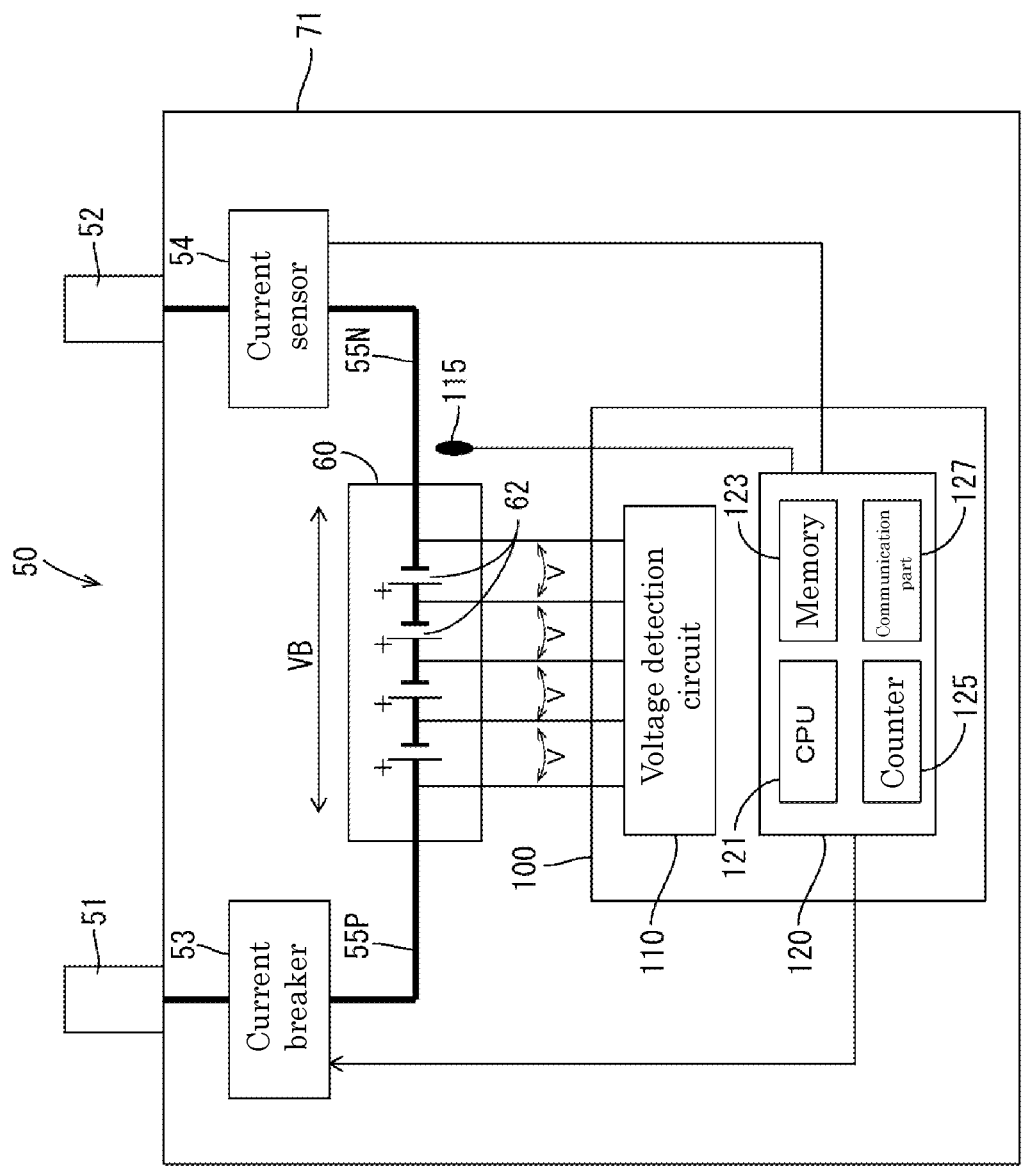
FIG. 6 is a block diagram showing an electrical configuration of the battery.

FIG. 5 is a block diagram showing the electrical configuration of the vehicle 10, and FIG. 6 is a block diagram showing the electrical configuration of the battery 50.

As shown in FIG. 5, the vehicle 10 includes an engine 20 that is a drive apparatus, an engine control part 21, an engine starter 23, an alternator 25 that is a vehicle generator, a general electric load 27, a vehicle electronic control unit (ECU) 30, a battery 50, and the like.

Battery 50 is connected to a power line 37. The engine starter 23, the alternator 25, and the general electric load 27 is connected to the battery 50 via the power line 37.

The engine starter 23 is a cell motor. When an ignition switch 24 is turned on, a cranking current flows from the battery 50 to drive the engine starter 23. By driving the engine starter 23, a crankshaft rotates to start the engine 20.

The general electric load 27 is an electric load mounted on the vehicle 10, excluding the engine starter 23. The general electric load 27 is rated at 12 V and can be exemplified by an air conditioner, audio equipment, a car navigation system, accessories, and the like.

The alternator 25 is a vehicle generator that generates power by the power of the engine 20. When the amount of power generated by the alternator 25 exceeds the amount of electric load of the vehicle 10, the alternator 25 charges the battery 50. When the amount of power generated by the alternator 25 is smaller than the amount of electric load of the vehicle 10, the battery 50 discharges to compensate for the shortage of the amount of power generated.

The vehicle ECU 30 is connected to the battery 50 so as to be able to communicate therewith via a communication line L1 and is connected to the alternator 25 so as to be able to communicate therewith via a communication line L2. The vehicle ECU 30 receives information about SOC from the battery 50 and controls the amount of power generated by the alternator 25, thereby controlling the SOC of the battery 50.

The vehicle ECU 30 is connected to the engine control part 21 so as to be able to communicate therewith via a communication line L3. The engine control part 21 is mounted on the vehicle 10 and monitors the operation state of the engine 20. The engine control part 21 monitors the traveling state of the vehicle 10 from measured values of instruments such as a speed measuring instrument. The vehicle ECU 30 can obtain, from the engine control part 21, information about turning on and off of the ignition switch 24, information about the operation state of the engine 20, and information about the traveling state (traveling, stopping traveling, stopping idling, etc.) of the vehicle 10.

As shown in FIG. 6, the battery 50 includes a current breaker 53, an assembled battery 60, a current sensor 54, a management apparatus 100, and a temperature sensor 115. The battery 50 is a low-voltage battery having a rating of 12 V The current breaker 53, the assembled battery 60, and the current sensor 54 are connected in series via power lines 55P 55N. The power line 55P is a power line for connecting the external terminal 51 of the positive electrode and the positive electrode of the assembled battery 60. The power line 55N is a power line for connecting the external terminal 52 of the negative electrode to the negative electrode of the assembled battery 60.

The current breaker 53 is located on the positive electrode side of the assembled battery 60 and is provided on the power line 55P of the positive electrode. The current sensor 54 is located on the negative electrode side of the assembled battery 60 and is provided on the power line 55N of the negative electrode.

The current breaker 53 can be made of a contact switch (mechanical type) such as a relay, or a semiconductor switch such as a field-effect transistor (FET). By opening the current breaker 53, the battery 50 is disconnected from the power line 37 of the vehicle 10 to interrupt the current. By closing the current breaker 53, the battery 50 is connected to the power line 37 and comes into a state of being able to supply power to the vehicle 10. The current breaker 53 is controlled so as to be opened when there is an abnormality in the battery 50, and is configured so as to be closed at the normal time.

The current sensor 54 measures a current I [A] of the assembled battery 60. The temperature sensor 115 measures the temperature [° C.] of the assembled battery 60 in a contact or non-contact manner.

The management apparatus 100 is provided in the circuit board unit 65. The management apparatus 100 includes a voltage detection circuit 110 and a processing part 120. The voltage detection circuit 110 is connected to both ends of each secondary battery 62 by signal lines and measures a voltage V [V] of each secondary battery 62 and a total voltage VB [V] of the assembled battery 60. The total voltage VB of the assembled battery 60 is the total voltage of the four secondary batteries 62 connected in series. The current sensor 54, the temperature sensor 115, and the voltage detection circuit 110 are a measurement part for measuring the state of the secondary battery 62.

The processing part 120 includes a CPU 121 having an arithmetic function, a memory 123, which is a storage part, a counter 125, and a communication part 127.

The processing part 120 can obtain information on the state of the vehicle 10 from the vehicle ECU 30, such as whether the vehicle 10 is parked or traveling.

A processing part 120 measures the current I of the assembled battery 60, the voltage V and the temperature of each secondary battery 62 at a predetermined measurement cycle N by the current sensor 54, the voltage detection circuit 110, and the temperature sensor 115 to monitor the state of the battery 50. The measurement cycle N has a short cycle of about 10 mS and a long cycle of about 60 s. The processing part 120 monitors the battery 50 at the short cycle when the battery 50 is in a use state such as during engine drive, and monitors the battery 50 at the long cycle when there is almost no current in the battery 50 such as during parking. By switching the measurement cycle N in accordance with the current value of the battery 50 and the state of the vehicle, the power consumption of the management apparatus 100 can be reduced. The processing part 120 estimates the SOC of the assembled battery 60 by an OCV method to be described later.

The memory 123 is a non-volatile storage medium such as flash memory or an electrically erasable programmable read-only memory (EEPROM). The memory 123 stores a monitoring program for monitoring the state of the assembled battery 60 and data necessary for executing the monitoring program.

In order to determine whether or not the OCV method can be executed, the memory 123 stores a program for executing a count processing (FIG. 13) for counting an elapsed time Tw since the current became equal to or smaller than a threshold Y (first threshold and second threshold), a program for executing SOC estimation processing (FIG. 14) by the OCV method, and the like. Various pieces of data necessary for executing each program are stored. The various data include data of a SOC curve Lv, data of the threshold Y, data of an allowable value X, and the like.

2. OCV-SOC Characteristic of Secondary Battery

Figure 7:
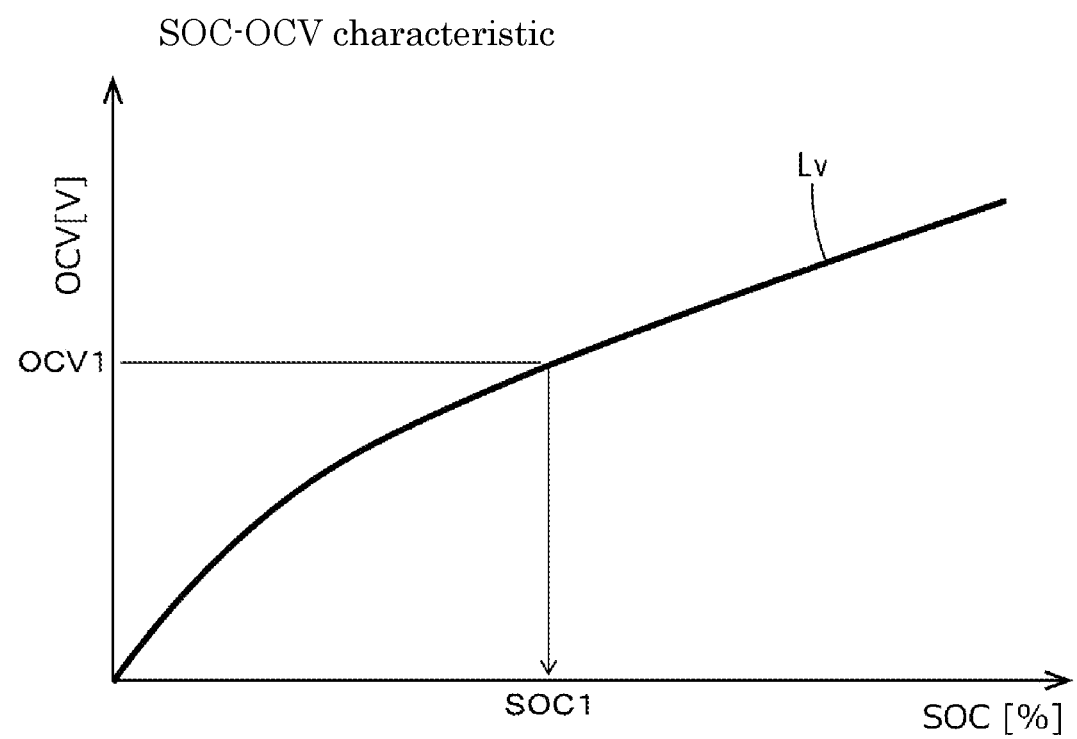
FIG. 7 is a SOC curve of the secondary battery.

FIG. 7 is the SOC curve Lv showing the correlation between the OCV and the SOC of the secondary battery 62, where the horizontal axis is the SOC [%], and the vertical axis is OCV [V]. The secondary battery 62 is a ternary lithium ion secondary battery using a lithium containing metal oxide containing elements of Co, Mn, and Ni as a positive active material and hard carbon as a negative electrode.

The OCV (open circuit voltage) is the voltage of the secondary battery 62 in a state where there can be considered to be no current. A state where the current of the secondary battery 62 is equal to or smaller than the threshold Y is a state where there can be considered to be no current. The threshold Y is, for example, 100 mA.

The SOC (state of charge) is the state of charge of the secondary battery 62. The SOC is a ratio of the residual capacity to the full charge capacity (actual capacity) of the secondary battery 62 and can be defined by Equation (1) below.

$$SOC\ [\%] = Cr/Co \times 100 \quad (1)$$

Co is a full charge capacity of a secondary battery, and Cr is a residual capacity of the secondary battery.

3. SOC Estimation by OCV Method

The OCV method is a method for estimating the SOC of the secondary battery 62 based on the OCV of the secondary battery 62. The OCV method is a method for obtaining the SOC corresponding to the OCV of the secondary battery 62 by referring to the OCV with the SOC curve Lv. For example, as shown in FIG. 7, when the OCV is OCV1, the SOC is estimated to be SOC1.

The SOC of the assembled battery 60 can be obtained by calculating the SOC of each of four secondary batteries 62 connected in series and using the average SOC and the minimum SOC. For the four secondary batteries 62, the average value and the minimum value of the OCV may be determined, and the corresponding SOC may be determined.

4. Stabilization Time and Execution Conditions of OCV Method

Even when the charge and discharge of the secondary battery 62 are almost stopped and the state thereof becomes a state where there can be considered to be no current, immediately after the state becomes the state where there can be considered to be no current, the voltage of the secondary battery 62 fluctuates because the chemical reaction continues inside. When the state where there can be considered to be no current continues, the chemical reaction decreases with time, and the voltage eventually becomes stable.

Hence, it is preferable to perform the SOC estimation by the OCV method after the lapse of the stabilization time from when the secondary battery 62 came into the state where there can be considered to be no current, and the voltage of the secondary battery 62 has become stable. The stabilization time is a time required for the voltage to become stable after the secondary battery 62 comes into the state where there can be considered to be no current, and the stabilization time is 12 hours, for example.

When the current I of the assembled battery 60 falls below the threshold Y, the processing part 120 determines that the assembled battery 60 is in the no-current state, and the counter 125 starts counting the elapsed time Tw. When the elapsed time Tw reaches the stabilization time, the management apparatus 100 determines that the execution condition for the OCV method is satisfied. The count of the elapsed time Tw is continued when the no-current state continues even after the stabilization time is reached.

Figure 8:
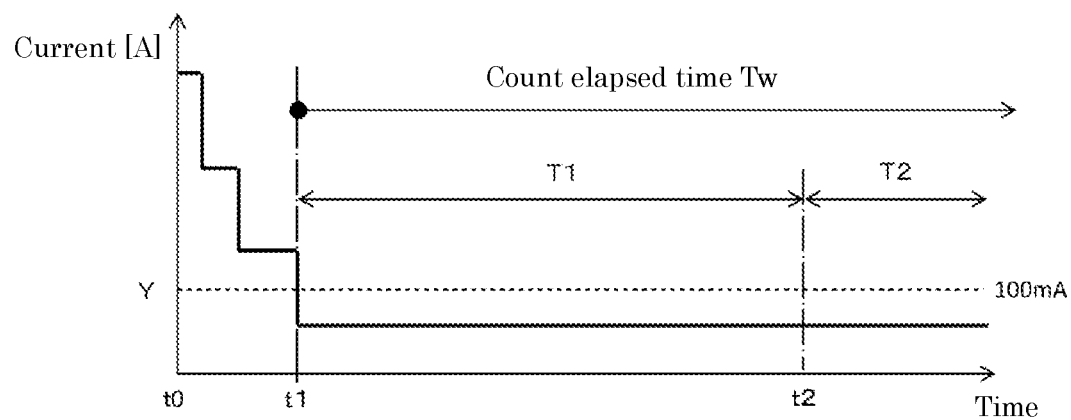
FIG. 8 is a current waveform of the secondary battery after parking.
Figure 9:
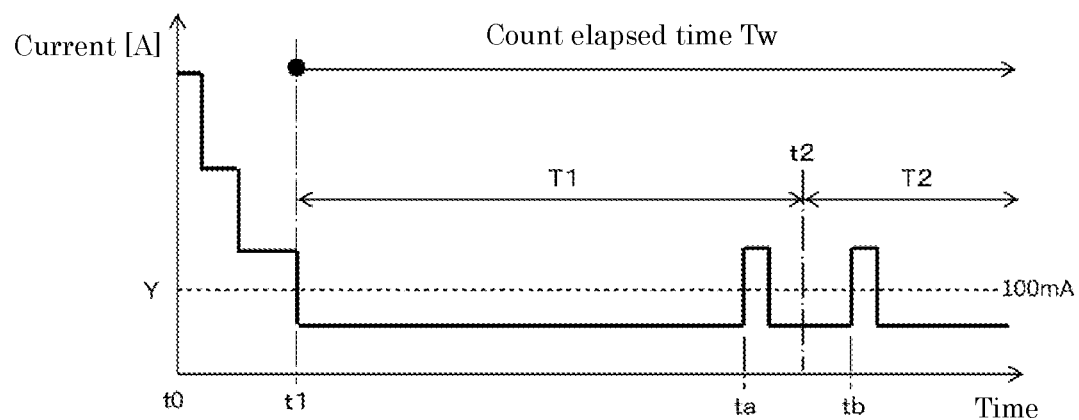
FIG. 9 is a current waveform of the secondary battery after parking.

The graphs of FIGS. 8 and 9 show the current waveform of the battery 50 after parking. Time t0 is the parking timing, time t1 is the timing when the current I of the secondary battery 62 falls below the threshold Y, and at time t1, the count of the elapsed time Tw by the counter 125 is started. As shown in FIG. 8, when the current I remains equal to or smaller than the threshold Y after time t1 and the no-current state continues, the stabilization time has elapsed at time t2, and the execution condition for the OCV method is satisfied. Thus, in period T2 after time t2 at which the execution condition for the OCV method is satisfied, the management apparatus 100 can obtain the OCV and estimate the SOC by the OCV method.

As shown in the graph of FIG. 9, at each of time to before the OCV method execution condition is satisfied and time tb after the OCV method execution condition is satisfied, the current I equal to or larger than the threshold Y flows in the secondary battery 62. A case where an in-vehicle GPS receiver receives GPS information and a case where an in-vehicle safety device operates can be exemplified as a factor for causing the current equal to or larger than the threshold Y to temporarily flow after parking.

Figure 10:
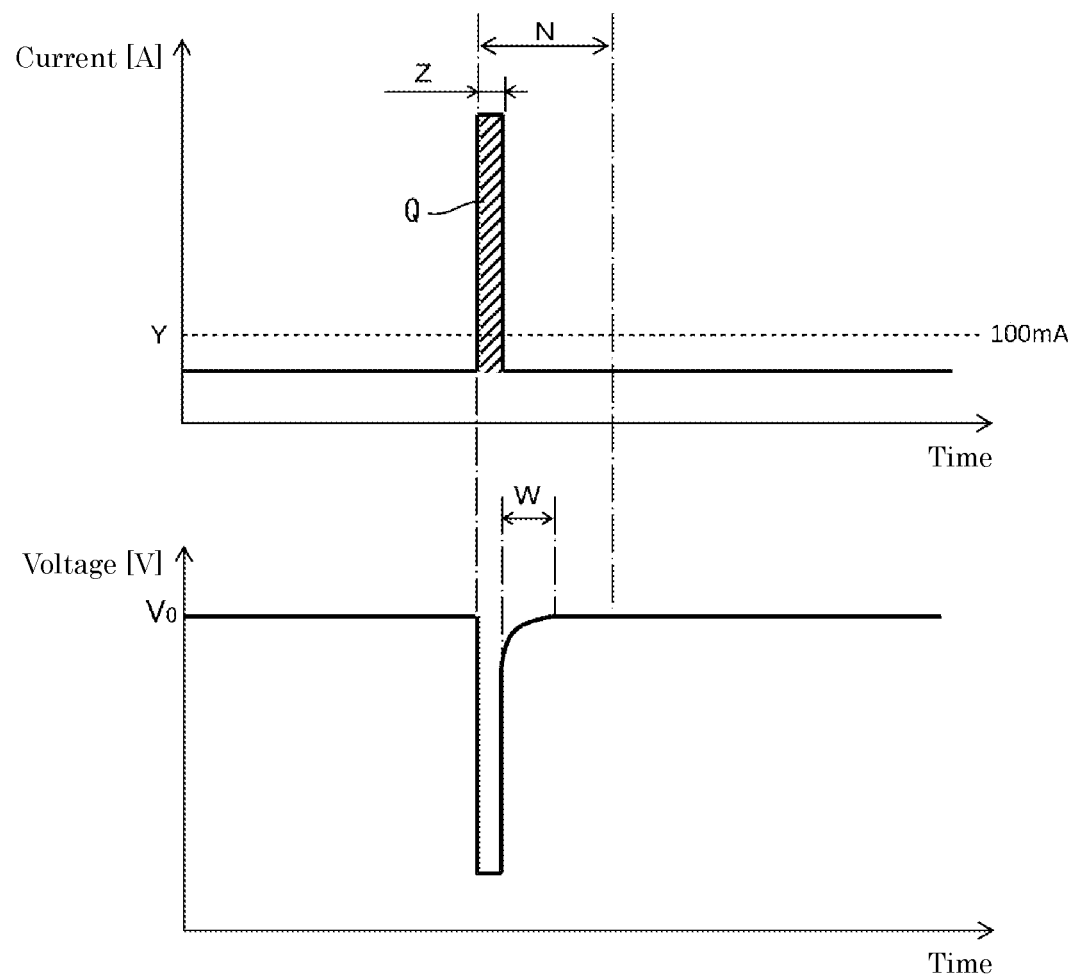
FIG. 10 is a current waveform and a voltage waveform of the secondary battery.
Figure 11:
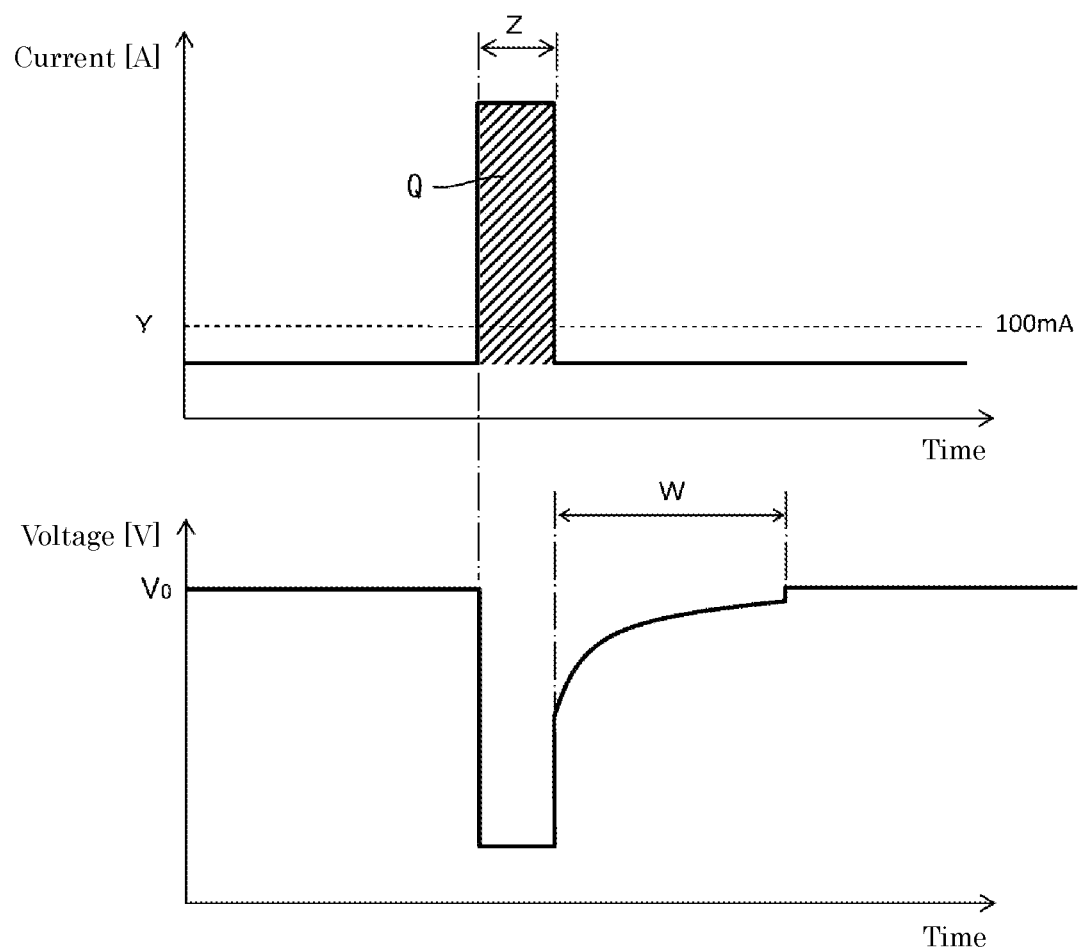
FIG. 11 is a current waveform and a voltage waveform of the secondary battery.

FIGS. 10 and 11 are graphs each showing a change in voltage when the secondary battery 62 temporarily discharges the current equal to or larger than the threshold Y from a state where the voltage of the secondary battery 62 is stable. In the two graphs, the magnitude of the current is the same, and a discharge time Z is different. In FIGS. 10 and 11, hatching indicates a current integration amount Q (discharge amount) of the current equal to or larger than the threshold Y. The unit of the current integration amount Q is [Ah].

A recovery time W until the voltage of the secondary battery 62 restores to an original voltage Vo after discharge is correlated with the current integration amount Q of the current I that is equal to or larger than the threshold Y, and the larger the current integration amount Q, the longer the recovery time W. That is, even when the current equal to or larger than the threshold Y flows, in a case where the current integration amount Q is small (in the case of FIG. 10), the chemical reaction of the secondary battery 62 converges quickly, and hence the influence on the voltage is small. In a case where the current integration amount Q is large (in the case of FIG. 11), the influence on the voltage is large because the chemical reaction of the secondary battery 62 converges slowly.

As shown in FIG. 9, when the current equal to or larger than the threshold Y temporarily flows in the battery 50 after the start of counting the elapsed time Tw, the processing part 120 compares the current integration amount Q of the current equal to or larger than the threshold Y with the allowable value X to determine whether or not to reset the counter 125 that measures the elapsed time Tw. Specifically, the processing part 120 resets the counter 125 when the current integration amount Q is larger than the allowable value X. "That the current integration amount Q is larger than the allowable value X" is an example of the predetermined condition. The reset is an example of the change.

By determining whether or not to perform the reset based on the comparison result between the current integration amount Q and the allowable value X, the frequency of resetting the counter 125 can be reduced and the frequency of obtaining the OCV can be increased as compared to a case where the counter 125 is always reset when the current equal to or larger than the threshold Y or more flows after the start of counting the elapsed time Tw.

Figure 12:
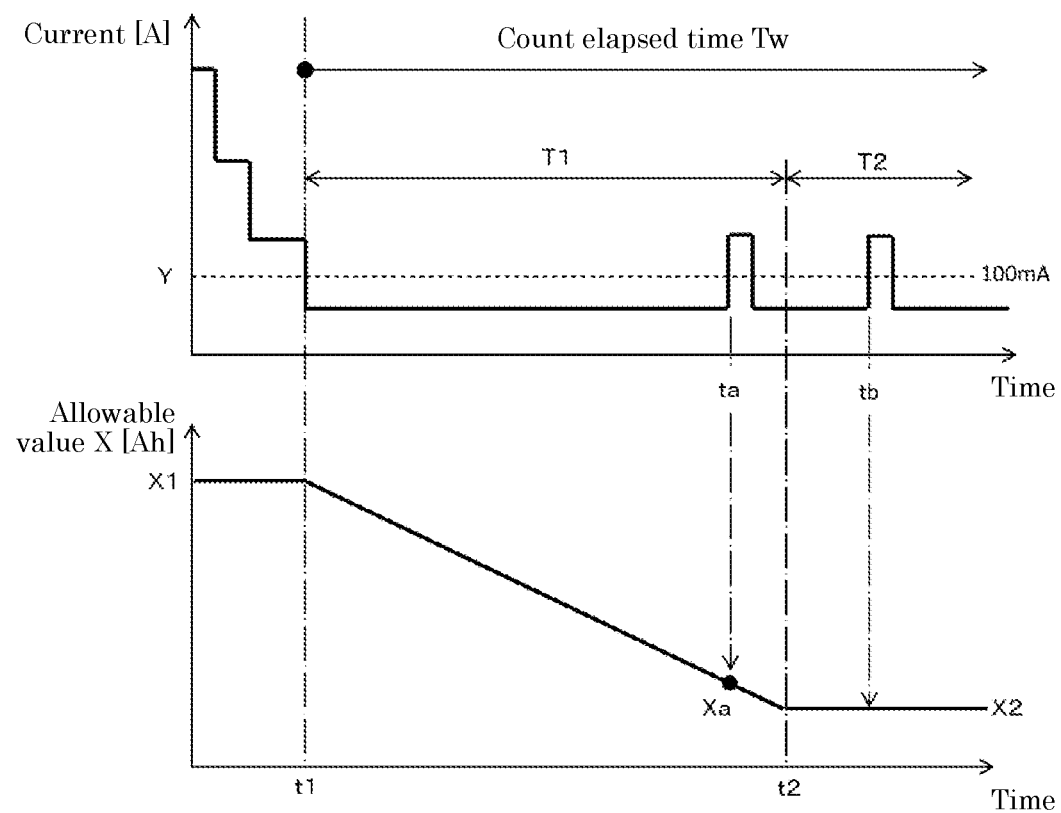
FIG. 12 is a diagram showing the relationship between an allowable value and elapsed time.

The allowable value X preferably varies depending on the elapsed time Tw. FIG. 12 is a graph showing the relationship between the allowable value X and the elapsed time Tw. The allowable value X is X1 at count start time (charge-discharge stop time) t1 and is the maximum. In period T1 from count start time t1 to time t2 at which the stabilization time has elapsed, the allowable value X linearly decreases, and in period T2 after the lapse of the stabilization time, an allowable value X2 is a constant value.

The reason why the allowable value X is smaller as the elapsed time Tw is longer is that the time until the stabilization time is reached is shorter when the elapsed time Tw is longer, and hence the influence of the change in voltage due to the current having temporarily flowed when the stabilization time is reached does not subside unless the allowable value X is made smaller.

The processing part 120 measures the current I of the assembled battery 60 and the voltage V and the temperature of each secondary battery 62 at a predetermined measurement cycle N during the parking of the vehicle 10 and performs monitoring processing for monitoring the state of the battery 50. The measurement cycle N is a long cycle (60 s).

Figure 13:
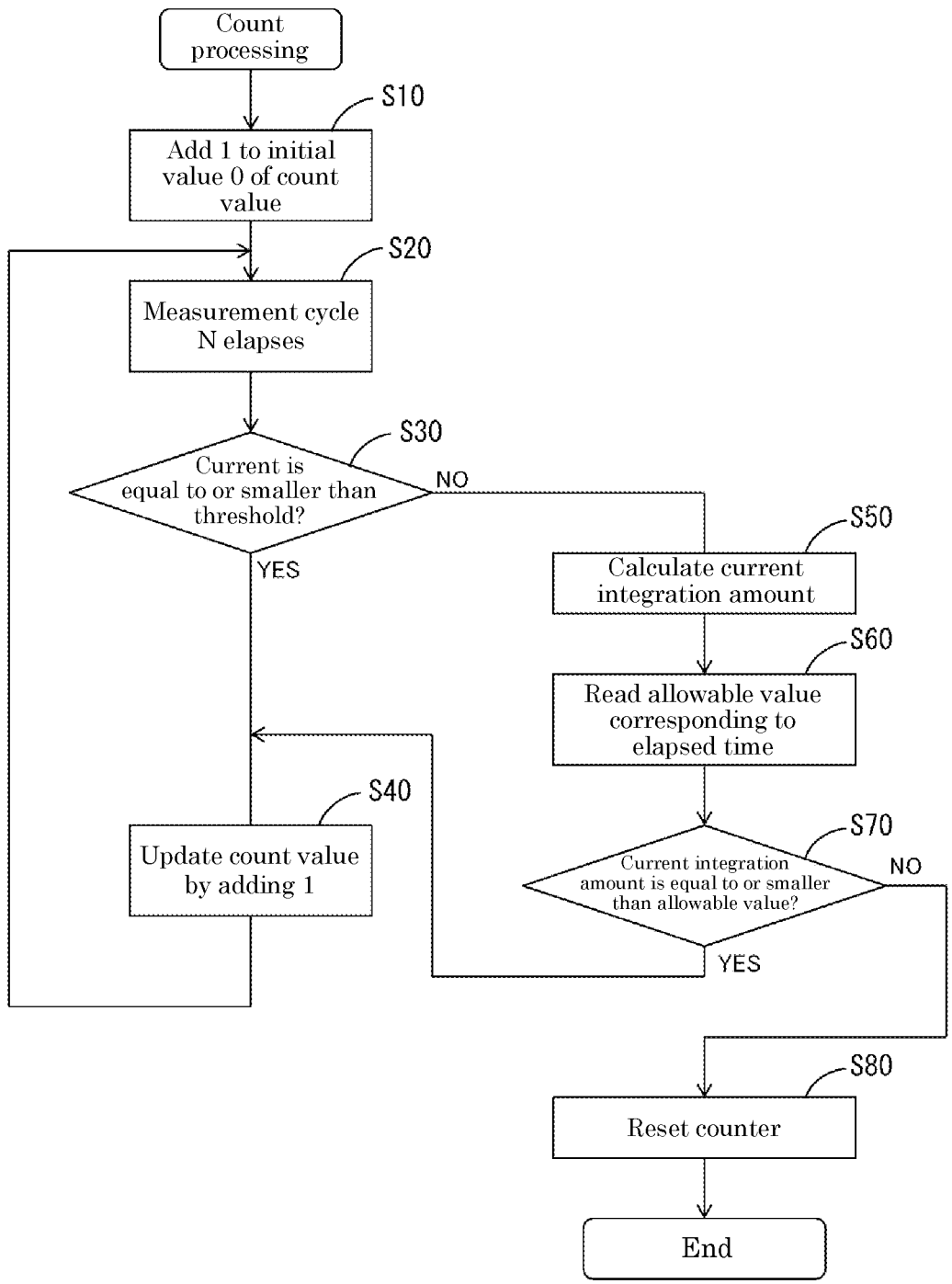
FIG. 13 is a flowchart of count processing.
Figure 14:
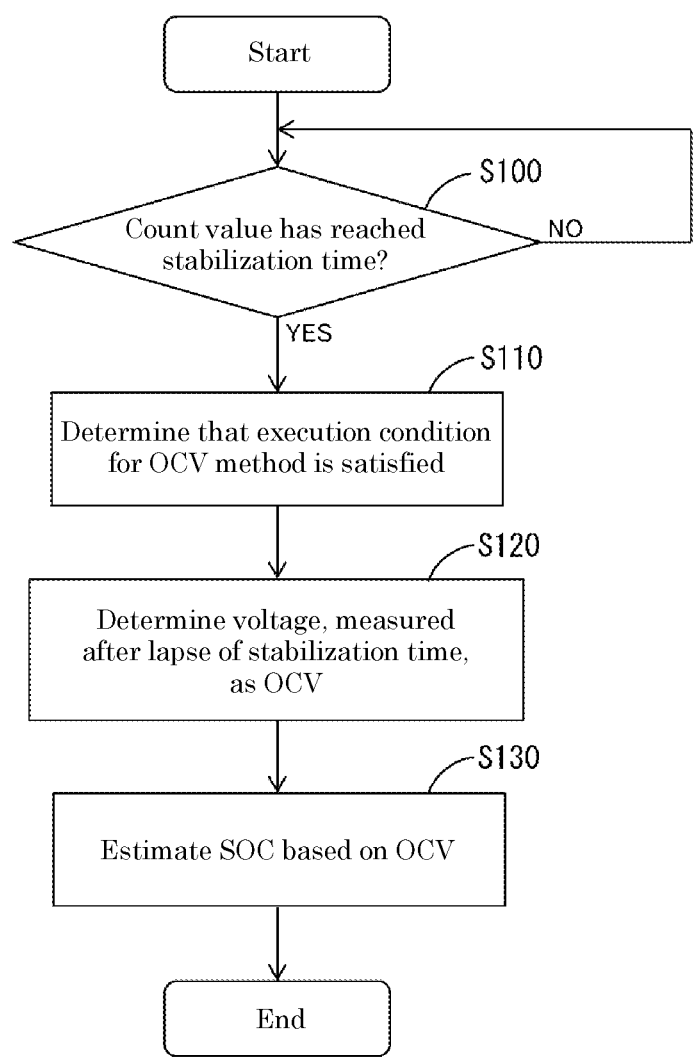
FIG. 14 is a flow for determining whether or not OCV method execution condition is satisfied.

FIG. 13 is a flowchart of the count processing executed by the processing part 120. FIG. 14 is a flow for determining whether or not the OCV method can be executed by the processing part 120.

The count processing is processing for counting the elapsed time Tw and is made up of eight steps from S10 to S80. The count processing is started when the current I of the assembled battery 60 becomes equal to or smaller than the threshold Y after the parking of the vehicle 10 (time t1 in FIGS. 8 and 9). The initial value of the counter 125 is "0".

When the count processing starts, the processing part 120 counts up the count value of the counter 125 by adding 1 to the initial value "0" (S10).

Thereafter, when the measurement cycle N elapses (S20), the processing part 120 compares the current I of the assembled battery 60 measured by the current sensor 54 with the threshold Y in the monitoring processing of the battery 50 and determines whether the current I is equal to or smaller than the threshold Y (S30).

After the start of the count processing, when the current I is equal to or smaller than the threshold Y (YES in S30), the processing part 120 adds 1 to the count value of the counter 125 to update the count value (S40). After the updating of the counter 125, the processing returns to S20, and the processing of S30 and S40 are performed.

As described above, when the current equal to or larger than the threshold Y is not flowing after the start of the count processing, the processing of S20→S30→S40 is repeated at the intervals of the measurement cycle N, and the count of the elapsed time Tw is advanced.

In addition to the count processing shown in FIG. 13, the processing part 120 executes the flow for determining whether or not the OCV method can be executed, which is shown in FIG. 14. In the determination flow, the processing part 120 compares the elapsed time Tw counted by the count processing with the stabilization time (an example of the predetermined value) (S100) and determines that the execution condition for the OCV method is satisfied when the elapsed time Tw exceeds the stabilization time (S110).

When determining that the execution condition for the OCV method is satisfied, the processing part 120 estimates the SOC by the OCV method. After the lapse of the stabilization time, the processing part 120 determines, in the monitoring processing of the battery 50, the voltage of each secondary battery 62 measured by the voltage detection circuit 110 as the OCV (S120). The processing part 120 refers to the OCV of each secondary battery 62 with the SOC curve Lv shown in FIG. 7 to estimate the SOC of each secondary battery 62 (S130). Then, the processing part 120 sets the minimum SOC to the SOC of the assembled battery 60.

In the example of FIG. 8, the elapsed time Tw reaches the stabilization time at time t2 after the start of the count processing at time t1. Therefore, the processing part 120 determines that the execution condition for the OCV method is satisfied at time t2 and estimates the SOC by the OCV method.

When the counter 125 is not reset in the middle after the start of the count at time t1, the elapsed time Tw is longer than the stabilization time after time t2, and the execution condition for the OCV method is always satisfied. Hence the processing part 120 repeats the SOC estimation by the OCV method at the measurement cycle N after time t2 at which the stabilization time has elapsed and obtains the estimated value of the SOC of each secondary battery 62 for each measurement cycle N.

On the other hand, when the current equal to or larger than the threshold Y flows after the count processing is started and before the execution condition for the OCV method is satisfied (time to shown in FIG. 9), NO determination is made in S30, and the processing part 120 calculates the current integration amount Q of the current equal to or larger than the threshold Y (S50). The current integration amount Q can be obtained by changing the measurement cycle N from the long cycle (60 s) to the short cycle (10 mS) after the detection of the current equal to or larger than the threshold Y, measuring the current I of the assembled battery 60 at the short cycle, and calculating the integration value of the data.

When calculating the current integration amount Q, the processing part 120 reads the allowable value X corresponding to the elapsed time Tw from the memory 123. Here, an allowable value Xa corresponding to time to is read.

When the current integration amount Q is equal to or smaller than the allowable value Xa (S70: YES), the processing part 120 determines that the current equal to or larger than the threshold Y has a small influence on the voltage at the time when the stabilization time has elapsed (time t2 in FIG. 9) and continues to count the elapsed time Tw (S40). Thereafter, the elapsed time Tw of the counter 125 reaches the stabilization time at time t2.

Even if the current equal to or larger than the threshold Y temporarily flows, the count of the elapsed time Tw is continued when the current integration amount Q is equal to or smaller than the allowable value Xa, whereby the elapsed time Tw reaches the stabilization time earlier than in a case where the counter 125 is reset, and hence the establishment frequency of the execution condition for the OCV method increases.

On the other hand, when the current integration amount Q is larger than the allowable value Xa (S70: NO), the processing part 120 determines that the current I equal to or larger than the threshold Y has a large influence on the voltage when the stabilization time has elapsed and resets the counter 125 (S80).

Figure 15:
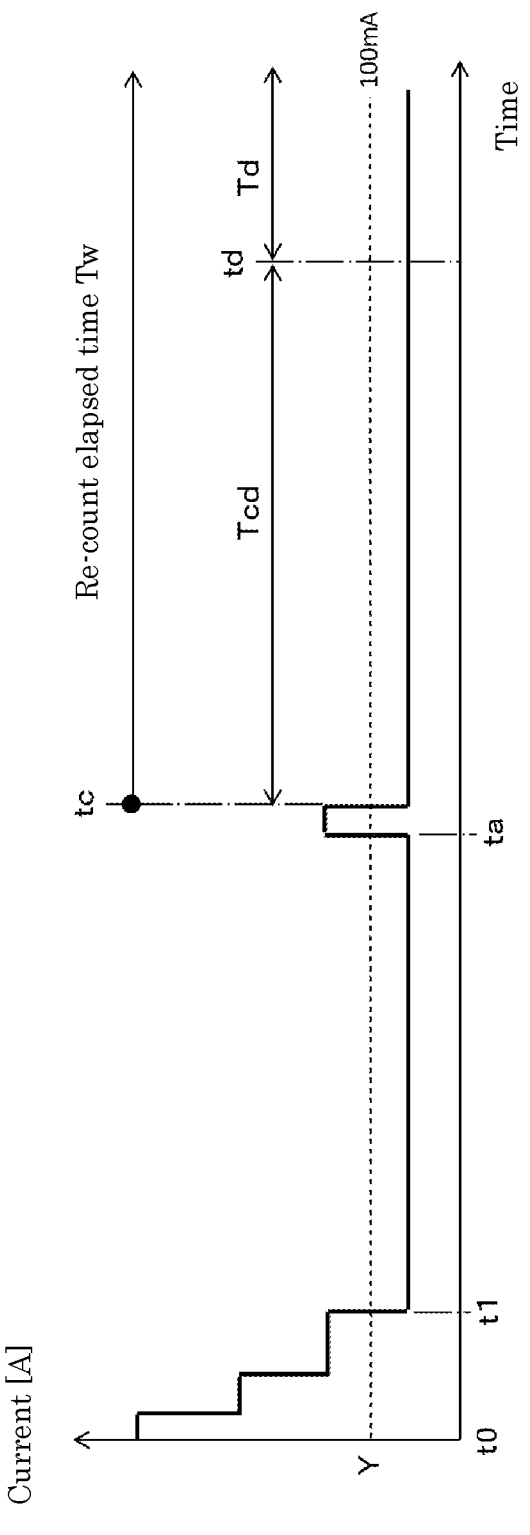
FIG. 15 is a current waveform of the secondary battery after parking.

When the counter 125 is reset, as shown in FIG. 15, at time tc when the current I falls below the threshold Y, the processing part 120 resumes the count processing by the counter 125 from the initial value of zero.

After the restart of the count processing, the execution condition for the OCV method is not satisfied in period Tcd until time td when the stabilization time has elapsed, and the execution condition for the OCV method is satisfied for the first time at time td when the stabilization time has elapsed. Therefore, in period Td after time td, the processing part 120 determines that the measured voltage of each secondary battery 62 is the OCV and estimates the SOC by the OCV method.

When the current integration amount Q is larger than the allowable value X, the counter 125 is once reset, and after the current I falls below the threshold Y, the count of the elapsed time Tw by the counter 125 is started again. By obtaining the OCV after the lapse of the stabilization time, it is possible to reduce the determination of the non-stable voltage as the OCV, thereby improving the SOC estimation accuracy.

When the execution condition for the OCV method is satisfied and the current equal to or larger than the threshold Y flows at a stage (time tb shown in FIG. 9) where the estimation of the SOC is executed at the measurement cycle N, the processing part 120 calculates the current integration amount Q of the current I equal to or larger than the threshold Y (S50).

Thereafter, the processing part 120 reads the allowable value X2 from the memory 123 (S60). The allowable value X2 is set so that the influence of the change in voltage due to the current having temporarily flowed I converges within the measurement cycle N, and the voltage becomes stable (cf. FIG. 10).

When the current integration amount Q is equal to or smaller than the allowable value X2, the processing part 120 does not perform the estimation of SOC by the OCV method in the measurement cycle N but performs the estimation in the next measurement cycle N. Also, the processing part 120 does not perform the reset of the counter 125, either.

On the other hand, when the current integration amount Q is larger than the allowable value X2 (S70: NO), the processing part 120 resets the counter 125 and restarts the count processing by the counter 125 from zero after the current I falls below the threshold Y.

When the elapsed time Tw exceeds the stabilization time after the restart of the count processing, the processing part 120 determines that the execution condition for the OCV method is satisfied. Thereafter, the processing part 120 determines that the voltage of each secondary battery 62 measured after the lapse of the stabilization time is the OCV and estimates the SOC by the OCV method.

6. Effect

The inventors have found that when the current I equal to or larger than the threshold Y temporarily flows after the start of counting the elapsed time Tw, whether or not there is a change in the time from the start of counting the elapsed time Tw until the voltage becomes stable correlates with the current integration amount Q of the current I having flowed temporarily. The processing part 120 resets (changes) the counter 125 when a predetermined condition in which the voltage of the secondary battery 62 is possibly not stable is satisfied at a time point where the count reaches the stabilization time (an example of the predetermined value) after the start of the count. Therefore, the frequency of resetting the counter 125 can be reduced as compared to a case where the counter 125 is always reset when a current of a certain magnitude flows temporarily.

By setting the predetermined condition as "the current integration amount Q is larger than the allowable value X", the frequency of resetting the counter 125 can be reduced, and the frequency of obtaining the OCV and the frequency of estimating the SOC can be increased, as compared to a case where the counter 125 is always reset when the current I equal to or larger than the threshold Y flows.

For appropriately determining the amount by which the count of elapsed time is to be changed, it is not desirable for the first threshold and the second threshold to be significantly different. According to the management apparatus 100, since the first threshold and the second threshold are the same values, the amount for changing the count of the elapsed time can be appropriately determined as compared to a case where the first threshold and the second threshold are different significantly.

As the elapsed time Tw after the start of the count becomes longer, the chemical reaction of the secondary battery 62 converges, and the voltage comes close to becoming stable. When the chemical reaction converges, and the voltage comes close to becoming stable, if the current I equal to or larger than the threshold Y flows, the influence of the change in voltage due to the current having temporarily flowed does not subside even when the stabilization time is reached. The allowable value X is made smaller as the elapsed time Tw after the start of the count is longer, to reduce the allowed current integration amount Q, so that the reaching the stabilization time can be prohibited while the voltage remains unstable. Since the non-stable voltage can be prevented from being determined as the OCV, the SOC estimation accuracy is improved.

Other Embodiments

The present invention is not restricted to the embodiments described above and the drawings, but, for example, the following embodiments are included in the technical scope of the present invention.

(1) In the above embodiment, the secondary battery 62 has been exemplified as an example of the energy storage device. The energy storage device is not limited to the secondary battery 62 but may be a capacitor. The secondary battery 62 is not limited to a lithium ion secondary battery but may be another nonaqueous electrolyte secondary battery. A lead-acid battery or the like can also be used. The energy storage device is not limited to a case where a plurality of energy storage devices are connected in series but may be connected in series or may have a single cell structure.

(2) In the above embodiment, when a current equal to or larger than the threshold Y flows after the start of counting the elapsed time Tw since the current I became equal to or smaller than the threshold Y, the current integration amount Q obtained by integrating the current equal to or larger than the threshold Y is compared with the allowable value X to determine whether or not to restore the count of the elapsed time Tw. Whether or not to restore the count of the elapsed time Tw may be determined by any method so long as being determined based on the current integration amount Q. For example, the current integration amount Q may be ranked as "small", "medium", "large", and the like, and it may be determined whether or not to restore the count of the elapsed time Tw in accordance with the rank.

(3) In the above embodiment, the battery 50 has been a low-pressure battery with a rated voltage of 12 V. The battery 50 may be a high-voltage battery for driving a rated voltage of 100 V to 400 V. The use of the battery 50 is not limited to a specific use. The battery 50 may be used for various uses such as a use for a moving body (a vehicle, a ship, an automatic guided vehicle (AGV), etc.) and an industrial use (an energy storage apparatus for an uninterruptible power supply system or a photovoltaic power generating system).

(4) The timing when the OCV method is performed may be any time, regardless of the state of the vehicle, so long as the current I is equal to or smaller than the threshold Y, and the stabilization time has elapsed.

(5) In the above embodiment, the count of the elapsed time Tw has been reset in the case where the current integration amount Q of the current I equal to or larger than the threshold Y is larger than the allowable value X after the start of the count. The count of the elapsed time Tw may be reset when the current integration amount Q of the current I equal to or larger than the threshold Y is not less than the allowable value X.

In the above embodiment, the count of the elapsed time Tw has not been reset in the case where the current integration amount Q of the current I equal to or larger than the threshold Y is equal to or smaller than the allowable value X after the start of the count. The count of the elapsed time Tw may not be reset when the current integration amount Q of the current I equal to or larger than the threshold Y is smaller than the allowable value X.

(6) In the above embodiment, the count of the elapsed time Tw has been reset in the case where the current integration amount Q of the current I equal to or larger than the threshold Y is larger than the allowable value X after the start of the count, and the count of the elapsed time Tw has not been reset in the case where the current integration amount Q of the current I equal to or larger than the threshold Y is equal to or smaller than the allowable value X after the start of the count. So long as at least the count of the elapsed time Tw is reset when the current integration amount Q of the current I equal to or larger than the threshold Y is larger than the allowable value X after the start of the count, the count of the elapsed time Tw may or may not be reset when the current integration amount Q of the current I equal to or larger than the threshold Y is equal to or smaller than the allowable value X.

(7) In the above embodiment, the count of the elapsed time Tw has been reset in the case where the current integration amount Q of the current I equal to or larger than the threshold Y is larger than the allowable value X after the start of the count, and the count of the elapsed time Tw has not been reset in the case where the current integration amount Q of the current I equal to or larger than the threshold Y is equal to or smaller than the allowable value X after the start of the count. So long as at least the count of the elapsed time Tw is not reset when the current integration amount Q of the current I equal to or larger than the threshold Y is equal to or smaller than the allowable value X after the start of the count, the count of the elapsed time Tw may or may not be reset when the current integration amount Q of the current I equal to or larger than the threshold Y is larger than the allowable value X.

(8) In the above embodiment, the management apparatus 100 has been provided inside the battery 50. The battery 50 may have at least the assembled battery 60 and a measuring instrument, and the management apparatus 100 may be provided outside the battery 50.

(9) In the above embodiment, the allowable value X has been determined in accordance with the elapsed time Tw, but the allowable value X may be a fixed value regardless of the elapsed time Tw.

(10) In the above embodiment, the count of the elapsed time Tw has been reset and restored to zero, which is the initial value, in the case where the current integration amount Q of the current I equal to or larger than the threshold Y exceeds the allowable value after the start of the count. When the current integration amount Q of the current I equal to or larger than the threshold Y is larger than the allowable value X after the start of the count, the count may be changed so that the elapsed time Tw becomes shorter, in addition to that the count of the elapsed time Tw is restored to zero which is the initial value. For example, when the elapsed time Tw is counted as eight hours at a time point (time t0 in FIG. 9) where the current I equal to or larger than the threshold Y flows, the count may be changed to six hours. How much the elapsed time Tw is to be restored (the amount by which the count is to be changed) may be determined in accordance with the current integration amount Q. It is preferable that the larger the current integration amount Q, the longer time that is restored.

(11) In the above embodiment, the predetermined condition has been "that the current integration amount Q is larger than the allowable value X", but the predetermined condition may be "that the time during which the current equal to or larger than the second threshold flowed is larger than an allowable value". For example, the count may be reset when the time during which the current value was equal to or larger than the second threshold is longer than one second (an example of the allowable value in the claims), and the count may not be changed when the current value is less than 1 second.

Alternatively, the amount by which the count is to be changed may be determined based on the time when the current equal to or larger than the second threshold flowed, rather than the two-choice of whether or not to reset the count. For example, the amount by which the count is to be changed may be increased as the time during which the current value of the current I was equal to or larger than the second threshold becomes longer. Alternatively, the amount by which the count is to be changed may be increased as the current integration amount Q obtained by integrating the current equal to or larger than the second threshold is larger. Specifically, as shown in Table 1 below, the amount by which the count is to be changed may be determined to be 10 when the time during which the current value was equal to or larger than the second threshold is less than 0.1 seconds. The amount may be determined to be 25 when the time is more than 0.1 seconds and less than five seconds. The amount may be determined to be 50 when the time is more than five seconds and less than ten seconds. In Table 1, a case where the time during which the current value was equal to or larger than the second threshold is ten seconds or more is omitted.

TABLE 1

| | Time | | |
|---|---|---|---|
| | 0.1 sec | 5 sec | 10 sec |
| Amount of change | 10 | 25 | 50 |

(12) The amount by which the count is to be changed may be determined based on the time during which the current value was equal to or larger than the second threshold and the current value measured during the time. Hereinafter, a specific description will be given with reference to Table 2.

TABLE 2

Temperature of secondary battery: 25° C.

| Current value | Time | | |
|---|---|---|---|
| | 0.1 sec | 5 sec | 10 sec |
| Amount of change | | | |
| 1 A | 10 | 25 | 50 |
| 10 A | 25 | 50 | 100 |
| 30 A | 50 | 100 | 300 |

Table 2 above has been set so that the amount by which the count is to be changed increases as the time during which the current value was equal to or larger than the second threshold increases, and the amount by which the count is to be changed increases as the maximum value of the current value measured during the time increases. In Table 2, cases are omitted where the time during which the current value was equal to or larger than the second threshold is ten seconds or more and where the maximum value Imax of the current value is 30 A or more.

For example, it is assumed that the maximum value Imax of the current value measured at the time during which the current value was equal to or larger than the second threshold is less than 1 A. In this case, in the example shown in Table 1, the amount by which the count is to be changed is determined to be 10 when the time during which the current value was equal to or larger than the second threshold is less than 0.1 seconds. The amount is determined to be 25 when the time is more than 0.1 seconds and less than five seconds. The amount is determined to be 50 when the time is more than five seconds and less than ten seconds. The same applies to a case where the maximum value Imax of the current value is 1 A or more and less than 10 A and a case where the maximum value Imax is 10 A or more and less than 30 A.

Instead of the maximum value of the current value, the determination may be made based on the minimum value, the average value, the intermediate value, or the like of the current value measured in the time during which the current value of the current I was equal to or larger than the second threshold.

(13) A recovery time W until the voltage of the secondary battery 62 is restored to the original voltage Vo after discharge is correlated with the internal resistance value of the secondary battery 62, and the recovery time W is longer as the internal resistance value is larger. For this reason, the amount by which the count is to be changed may be determined based on the time during which the current equal to or larger than the second threshold flowed and the internal resistance value of the secondary battery 62. Specifically, the time for restoring the count may be made longer as the internal resistance value of the secondary battery 62 is larger.

Figure 16:
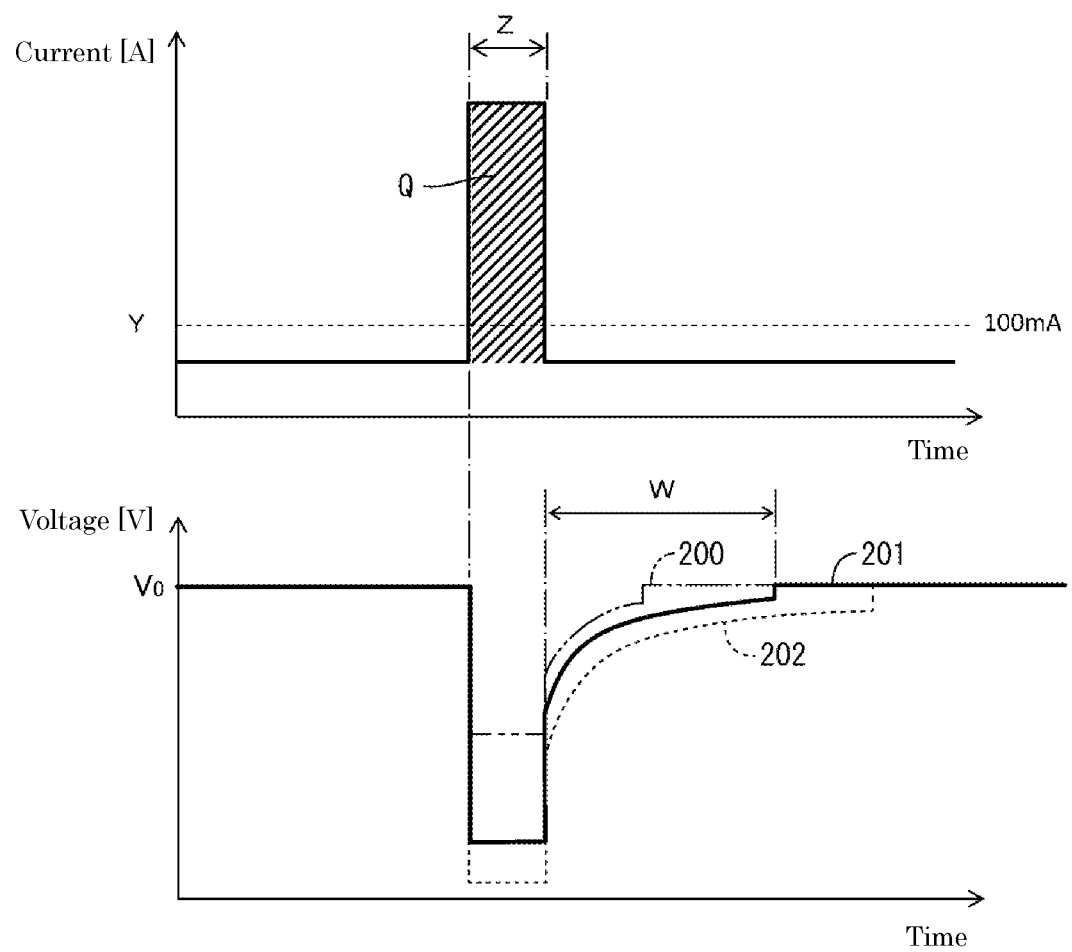
FIG. 16 is a current waveform and a voltage waveform of the secondary battery.

For example, in FIG. 16, a dashed line 200 indicates a change in voltage when the temperature of the secondary battery 62 is high, a dotted line 202 indicates a change in voltage when the temperature of the secondary battery 62 is low, and a solid line 201 indicates a change in voltage when the temperature is in between. As shown in FIG. 16, when the temperature of the secondary battery 62 is high (dashed line 200), the internal resistance value is small, so that the voltage drop is small. Thus, the time until the voltage becomes stable is short. In contrast, when the temperature of the secondary battery 62 is low (dotted line 202), the internal resistance value becomes large, so that the voltage drop is large. Thus, the time until the voltage becomes stable is long. Therefore, the amount by which the count of elapsed time is to be changed may be made larger as the temperature of the secondary battery 62 is lower. Hereinafter, a specific description will be given with reference to Table 2 described above and Tables 3 and 4 shown below.

TABLE 3

Temperature of secondary battery: 30° C.

| Current value | Time | | |
|---|---|---|---|
| | 0.1 sec | 5 sec | 10 sec |
| Amount of change | | | |
| 1 A | 5 | 12.5 | 25 |
| 10 A | 12.5 | 25 | 50 |
| 30 A | 25 | 50 | 150 |

TABLE 4

Temperature of secondary battery: 50° C.

| Current value | Time | | |
|---|---|---|---|
| | 0.1 sec | 5 sec | 10 sec |
| Amount of change | | | |
| 1 A | 0 | 0 | 0 |
| 10 A | 6.25 | 12.5 | 25 |
| 30 A | 12.5 | 25 | 75 |

It is assumed that Table 2 described above is a table when the temperature Tmp of the secondary battery is 20° C.≤Tmp<25° C. Table 3 is a table when 25° C.≤Tmp<30° C., and Table 4 is a table when the temperature of the secondary battery is 30° C.≤Tmp<50° C. These tables are set so that the amount by which the count is to be changed is larger as a temperature Tmp of the secondary battery is lower.

Here, the case has been described where the amount by which the count is to be changed is determined based on three of the time during which the current equal to or larger than the second threshold flowed, the current value, and the temperature. However, the determination may be made based on two of the time during which the current equal to or larger than the second threshold flowed and the temperature. Instead of the time during which the current equal to or larger than the second threshold flowed, the determination may be made based on three of the current integration amount Q, the current value, and the temperature, or the determination may be made based on two of the current integration amount Q and the temperature.

Since the internal resistance value increases as the degree of deterioration in the secondary battery 62 increases, the internal resistance value may be determined based on the degree of deterioration of the secondary battery 62 rather than the temperature of the secondary battery. Specifically, the time for the restoring back may be made longer as the degree of deterioration in the secondary battery 62 is larger. However, the temperature is largely influenced on the internal resistance value than the degree of deterioration, and it is thus more desirable to use the temperature rather than the degree of deterioration.

(14) In the above embodiment, the second threshold is always constant, but the second threshold may be made smaller as the elapsed time after the start of the count is longer. For example, the second threshold may be I1 for the first one hour, I1−ΔI for the first to third hours, and I1−ΔI×2 for the third to sixth hours. How the second threshold is set by dividing the time can be determined appropriately.

When a current of a certain magnitude flows, the voltage may become stable by the stabilization time in a case where the remaining time until the stabilization time is reached is long. In contrast, when the remaining time until the stabilization time is reached is short, the voltage may not become stable by the stabilization time. When the remaining time until the stabilization time is reached is short, the time until the voltage becomes table can be ensured by reducing the second threshold.

(15) In the above embodiment, the case where the first threshold and the second threshold are the same has been described as an example, but these may not be completely the same. For example, when the first threshold is 1 A, the second threshold may be 0.99 A or 1.01 A. However, it is not desirable that the difference between the first threshold and the second threshold is excessively large.

(16) In the above embodiment, as the predetermined conditions, "that the current integration amount obtained by integrating the current equal to or larger than the second threshold is larger than the allowable value" and "that the time during which the current equal to or larger than the second threshold flowed is larger than the allowable value" have been explained as examples. However, the predetermined condition may be a condition except for the above conditions so long as being a condition in which the voltage of the secondary battery 62 is possibly not stable at the point where the count reaches the predetermined value.

The predetermined condition may be another condition which is substantially the same as "that the current integration amount obtained by integrating the current equal to or larger than the second threshold is larger than the allowable value" or "that the time during which the current equal to or larger than the second threshold flowed is larger than the allowable value". For example, the predetermined condition may be "that a value, obtained by multiplying the current integration amount obtained by integrating a current equal to or larger than the second threshold by −1, may be smaller than an allowable value" or "that a value, obtained by multiplying the time during which the current equal to or larger than the second threshold flowed by −1, may be smaller than an allowable value". Alternatively, the predetermined condition may be "that the value, obtained by subtracting the current integration amount obtained by integrating the current equal to or larger than the second threshold from a specific value, is smaller than an allowable value" or "that a value, obtained by subtracting the time during which the current equal to or larger than the second threshold flowed from a specific value, is smaller than an allowable value".

Figure 17:
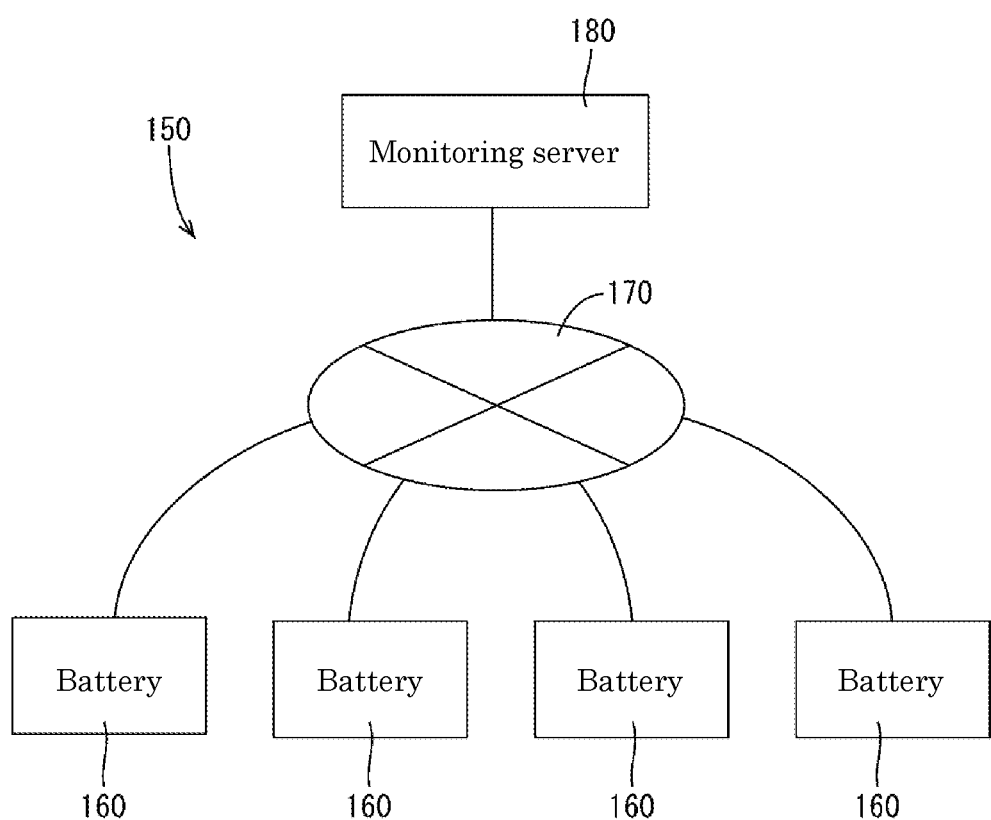
FIG. 17 is a block diagram of a remote monitoring system for the battery.

(17) FIG. 17 shows a system 150 for remotely monitoring a plurality of batteries 160 by using a monitoring server 180 that is a management apparatus via a network 170. The plurality of batteries 160 each have at least an energy storage device, a measuring instrument, and a communication function and transmit the measurement data of the current, voltage, and temperature of the energy storage device to the monitoring server 180 via the network 170. The monitoring server 180 monitors the state of each battery 160 based on the measurement data transmitted from each battery 160. For each battery 160, the monitoring server 180 counts the elapsed time Tw since the current of the energy storage device became equal to or smaller than a threshold. When the current I equal to or larger than the threshold Y flows after the start of the count, the monitoring server 180 may determine an amount by which the count of the elapsed time Tw is to be changed based on the current integration amount Q obtained by integrating the current I equal to or larger than the threshold Y.

(18) The present technique can be applied to a management program for an energy storage device. A management program for the energy storage device is a program that causes a computer to execute processing (S70) in which, after a start of counting an elapsed time since a current of the energy storage device became equal to or smaller than a first threshold, when a predetermined condition in which a voltage of the energy storage device is possibly not stable is satisfied at a time point where the count reaches a predetermined value, the count of the elapsed time is changed. The present technique can be applied to a recording medium in which the management program for the energy storage device is recorded. The computer is, for example, the processing part 120 of the management apparatus 100.

DESCRIPTION OF REFERENCE SIGNS

10: vehicle
50: battery (management apparatus)
53: current breaker
60: assembled battery
62: secondary battery (energy storage device)
100: management apparatus
120: processing part
123: memory
125: counter
Tw: elapsed time
Q: current integration amount
X: allowable value
Y: threshold (first threshold and second threshold)

The invention claimed is:

1. A management apparatus for an energy storage device, comprising a processor,
   wherein the processor is, to determine an open circuit voltage (OCV) of the energy storage device, configured for:
   after a start of counting an elapsed time since a current of the energy storage device becomes equal to or smaller than a first threshold, when a predetermined condition, in which a voltage of the energy storage device is possibly not stable even when the elapsed time reaches a stabilization time, is satisfied at a time point where the count reaches a predetermined value, the count of the elapsed time is changed, and
   when the count of the elapsed time reaches the stabilization time, a voltage of the energy storage device measured after a lapse of the stabilization time is taken as the OCV.

2. The management apparatus for an energy storage device according to claim 1, wherein the predetermined condition is that a current integration amount obtained by integrating a current equal to or larger than a second threshold is larger than an allowable value.

3. The management apparatus for an energy storage device according to claim 1, wherein the predetermined condition is that a time during which a current equal to or larger than a second threshold flows is larger than an allowable value.

4. The management apparatus according to claim 2, wherein the second threshold is smaller as the elapsed time after the start of the count is longer.

5. The management apparatus for an energy storage device according to claim 2, wherein the first threshold and the second threshold are the same values.

6. The management apparatus according to claim 2, wherein the allowable value is smaller as the elapsed time after the start of the count is longer.

7. The management apparatus according to claim 2, wherein an amount by which the count of the elapsed time is to be changed is determined based on the time during which the current equal to or larger than the second threshold flows.

8. The management apparatus according to claim 7, wherein an amount by which the count of the elapsed time is to be changed is determined based on the time during which the current equal to or larger than the second threshold flows and a value correlated with an internal resistance value of the energy storage device.

9. The management apparatus according to claim 8, wherein the value correlated with the internal resistance value of the energy storage device is a temperature of the energy storage device.

10. The management apparatus according to claim 1, wherein estimation processing for estimating a state of charge (SOC) of the energy storage device is performed based on the OCV.

11. An energy storage apparatus comprising:
an energy storage device; and
the management apparatus according to claim 1.

12. The management apparatus according to claim 1, wherein the count is reset whenever the count of the elapsed time reaches the stabilization time.

13. A remote monitoring system, comprising:
a plurality of energy storage devices; and
a server comprising the management apparatus according to claim 1,
wherein the server remotely monitors the plurality of energy storage devices via a network.

14. A management method for an energy storage device, the method comprising:
counting an elapsed time since a current of the energy storage device becomes equal to or smaller than a first threshold;
changing the count of the elapsed time when a predetermined condition, in which a voltage of the energy storage device is possibly not stable even when the elapsed time reaches a stabilization time, is satisfied at a time point where the count reaches a predetermined value after a start of the count; and
when the count of the elapsed time reaches the stabilization time, taking a voltage of the energy storage device measured after a lapse of the stabilization time as an open circuit voltage (OCV).

15. A computer readable medium storing computer executable instructions of the management method according to claim 14.

16. The management method according to claim 14, wherein the predetermined condition is that a current integration amount obtained by integrating a current equal to or larger than a second threshold is larger than an allowable value.

17. The management method according to claim 16, wherein the second threshold is smaller as the elapsed time after the start of the count is longer.

18. The management method according to claim 16, wherein an amount by which the count of the elapsed time is to be changed is determined based on the time during which the current equal to or larger than the second threshold flows.

19. The management method according to claim 18, wherein an amount by which the count of the elapsed time is to be changed is determined based on the time during which the current equal to or larger than the second threshold flows and a value correlated with an internal resistance value of the energy storage device, wherein the value correlated with the internal resistance value of the energy storage device is a temperature of the energy storage device, and wherein the count is reset whenever the count of the elapsed time reaches the stabilization time.

20. The management method according to claim 14, wherein the predetermined condition is that a time during which a current equal to or larger than a second threshold flows is larger than an allowable value.

* * * * *